United States Patent
Palanduz et al.

(10) Patent No.: US 7,656,644 B2
(45) Date of Patent: Feb. 2, 2010

(54) ITFC WITH OPTIMIZED C(T)

(75) Inventors: Cengiz A. Palanduz, Chandler, AZ (US); Dustin P. Wood, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/972,579

(22) Filed: Jan. 10, 2008

(65) Prior Publication Data

US 2008/0106844 A1    May 8, 2008

Related U.S. Application Data

(62) Division of application No. 11/096,313, filed on Mar. 31, 2005, now Pat. No. 7,375,412.

(51) Int. Cl.
    *H01G 4/228* (2006.01)
(52) U.S. Cl. ............ 361/306.2; 361/306.1; 361/306.3; 361/301.4; 361/311; 361/313
(58) Field of Classification Search ............ 361/306.2, 361/306.1, 308.1, 321.1, 301.4, 303–305, 361/311–313, 306.3, 321.2
    See application file for complete search history.

(56) References Cited

U.S. PATENT DOCUMENTS

| | | |
|---|---|---|
| 4,241,378 A | 12/1980 | Dorrian |
| 4,458,295 A | 7/1984 | Durschlag et al. |
| 4,528,613 A | 7/1985 | Stetson et al. |
| 4,687,540 A | 8/1987 | Singhdeo et al. |
| 4,702,967 A | 10/1987 | Black et al. |
| 5,065,275 A | 11/1991 | Fujisaki et al. |
| 5,155,655 A | 10/1992 | Howard et al. |
| 5,160,762 A | 11/1992 | Brand et al. |
| 5,172,304 A | 12/1992 | Ozawa et al. |

(Continued)

FOREIGN PATENT DOCUMENTS

EP    0977218    2/2000

(Continued)

OTHER PUBLICATIONS

Office Action for 10/882,745, mailed Mar. 17, 2005 (12 pgs).

(Continued)

*Primary Examiner*—Nguyen T Ha
(74) *Attorney, Agent, or Firm*—Blakely, Sokoloff, Taylor & Zafman LLP

(57) ABSTRACT

A method including depositing a suspension of a colloid having an amount of nano-particles of a ceramic material on a substrate; and thermally treating the suspension to form a thin film. A method including depositing a plurality of nano-particles of a ceramic material to pre-determined locations across a surface of a substrate; and thermally treating the plurality of nano-particles to form a thin film. A system including a computing device having a microprocessor, the microprocessor coupled to a printed circuit board through a substrate, the substrate having at least one capacitor structure formed on a surface, the capacitor structure having a first electrode, a second electrode, and a ceramic material disposed between the first electrode and the second electrode, wherein the ceramic material has columnar grains.

21 Claims, 11 Drawing Sheets

U.S. PATENT DOCUMENTS

| | | | |
|---|---|---|---|
| 5,177,670 A | 1/1993 | Shinohara et al. | |
| 5,191,510 A | 3/1993 | Huffman | |
| 5,206,788 A | 4/1993 | Larson et al. | |
| 5,504,993 A | 4/1996 | Szerlip et al. | |
| 5,600,532 A * | 2/1997 | Michiya et al. | 361/305 |
| 5,745,334 A | 4/1998 | Hoffarth et al. | |
| 5,795,799 A | 8/1998 | Hosoya | |
| 5,796,572 A | 8/1998 | Kawai | |
| 5,800,575 A | 9/1998 | Lucas | |
| 5,889,647 A | 3/1999 | Hansen et al. | |
| 5,912,044 A | 6/1999 | Farooq et al. | |
| 5,952,040 A | 9/1999 | Yadav et al. | |
| 5,978,207 A | 11/1999 | Anderson et al. | |
| 5,989,935 A | 11/1999 | Abbott et al. | |
| 6,043,973 A | 3/2000 | Nagashima et al. | |
| 6,058,004 A | 5/2000 | Duva et al. | |
| 6,125,027 A | 9/2000 | Klee et al | |
| 6,178,082 B1 | 1/2001 | Farooq et al. | |
| 6,180,252 B1 | 1/2001 | Farrell et al. | |
| 6,207,522 B1 | 3/2001 | Hunt et al. | |
| 6,207,552 B1 | 3/2001 | Wang et al. | |
| 6,214,445 B1 | 4/2001 | Kanbe et al. | |
| 6,216,324 B1 | 4/2001 | Farooq et al. | |
| 6,226,172 B1 | 5/2001 | Sato et al. | |
| 6,351,368 B1 | 2/2002 | Kim | |
| 6,366,444 B1 | 4/2002 | Yagi | |
| 6,372,286 B1 | 4/2002 | Azuma et al. | |
| 6,407,929 B1 | 6/2002 | Hale et al. | |
| 6,433,993 B1 | 8/2002 | Hunt et al. | |
| 6,437,970 B1 | 8/2002 | Lee et al. | |
| 6,477,034 B1 | 11/2002 | Chakravorty et al. | |
| 6,524,352 B2 | 2/2003 | Adae-Amoakoh et al. | |
| 6,541,137 B1 | 4/2003 | Kingon et al. | |
| 6,577,490 B2 * | 6/2003 | Ogawa et al. | 361/306.1 |
| 6,586,791 B1 | 7/2003 | Lee et al. | |
| 6,597,068 B2 * | 7/2003 | Petrarca et al. | 257/752 |
| 6,617,681 B1 | 9/2003 | Bohr | |
| 6,623,865 B1 | 9/2003 | Zou et al. | |
| 6,631,551 B1 | 10/2003 | Bowles et al. | |
| 6,638,378 B2 | 10/2003 | O'Bryan et al. | |
| 6,672,912 B2 | 1/2004 | Figueroa | |
| 6,678,145 B2 * | 1/2004 | Naito et al. | 361/308.1 |
| 6,775,150 B1 * | 8/2004 | Chakravorty et al. | 361/761 |
| 6,795,296 B1 | 9/2004 | Palanduz et al. | |
| 6,891,258 B1 | 5/2005 | Alexander et al. | |
| 6,907,658 B2 | 6/2005 | Li | |
| 6,909,593 B2 * | 6/2005 | Kuroda et al. | 361/306.3 |
| 6,937,035 B2 | 8/2005 | Kawaike et al. | |
| 6,961,230 B2 * | 11/2005 | Otsuka et al. | 361/306.2 |
| 6,980,416 B2 | 12/2005 | Sakaguchi et al. | |
| 7,002,075 B2 * | 2/2006 | Kambe et al. | 174/565 |
| 7,038,235 B2 | 5/2006 | Seitz | |
| 7,072,167 B2 * | 7/2006 | Borland | 361/302 |
| 2001/0019144 A1 | 9/2001 | Roy | |
| 2001/0054748 A1 | 12/2001 | Wikborg et al. | |
| 2002/0058163 A1 | 5/2002 | Uzoh | |
| 2002/0080551 A1 | 6/2002 | Kitagawa et al. | |
| 2002/0081838 A1 | 6/2002 | Bohr | |
| 2002/0175402 A1 | 11/2002 | McCormack et al. | |
| 2003/0016026 A1 | 1/2003 | Kawaike et al. | |
| 2003/0039813 A1 | 2/2003 | Kitai et al. | |
| 2003/0136997 A1 | 7/2003 | Shioga et al. | |
| 2003/0170432 A1 | 9/2003 | Kobayashi et al. | |
| 2003/0174994 A1 | 9/2003 | Garito et al. | |
| 2003/0184953 A1 | 10/2003 | Lee et al. | |
| 2003/0207150 A1 | 11/2003 | Maria et al. | |
| 2003/0230768 A1 | 12/2003 | Seitz | |
| 2004/0027813 A1 | 2/2004 | Li | |
| 2004/0065912 A1 | 4/2004 | Liu et al. | |
| 2004/0081760 A1 | 4/2004 | Burns et al. | |
| 2004/0081811 A1 | 4/2004 | Casper et al. | |
| 2004/0089471 A1 | 5/2004 | Andoh et al. | |
| 2004/0126484 A1 | 7/2004 | Croswell et al. | |
| 2004/0175585 A1 | 9/2004 | Zou et al. | |
| 2004/0238957 A1 | 12/2004 | Akram et al. | |
| 2004/0257749 A1 | 12/2004 | Otsuka et al. | |
| 2005/0011857 A1 | 1/2005 | Borland et al. | |
| 2005/0118482 A1 | 6/2005 | Sriramulu et al. | |
| 2005/0151156 A1 | 7/2005 | Wu et al. | |
| 2005/0213020 A1 | 9/2005 | Takeda et al. | |
| 2006/0099803 A1 | 5/2006 | Min | |
| 2006/0143886 A1 | 7/2006 | Srinivasan et al. | |

FOREIGN PATENT DOCUMENTS

| | | |
|---|---|---|
| JP | 62250626 | 10/1987 |
| JP | 02-005507 | 1/1990 |
| JP | 03-178112 | 8/1991 |
| JP | 03208323 A | 9/1991 |
| JP | 050744651 | 3/1993 |
| JP | 07-122456 | 5/1995 |
| JP | 2002/297939 | 10/2001 |
| JP | 2002075782 | 3/2002 |
| JP | 2003163559 | 6/2003 |
| JP | 2003197463 | 7/2003 |

OTHER PUBLICATIONS

Office Action for 10/882,745, mailed Oct. 4, 2005 (10 pgs).
Office Action for 10/882,745, mailed Apr. 3, 2006 (9 pgs).
Office Action for 10/882,745, mailed Aug. 30, 2006 (12 pgs).
Office Action for 10/882,745, mailed Jan. 10, 2007 (13 pgs).
Office Action for 10/882,745, mailed May 1, 2007 (12 pgs).
Office Action for 10/882,745, mailed Sep. 27, 2007 (11 pgs).
Office Action for 10/882,745, mailed Jan. 16, 2008 (9 pgs).
Office Action for 10/971,829, mailed Mar. 8, 2006 (8 pgs).
Office Action for 10/971,829, mailed Aug. 14, 2006 (8 pgs).
Office Action for 10/971,829, mailed Jan. 3, 2007 (8 pgs.).
Office Action for 10/974,139, mailed Mar. 9, 2006 (10 pgs).
Office Action for 10/974,139, mailed Dec. 13, 2006 (11 pgs.).
Office Action for 10/974,139, mailed Apr. 17, 2007 (12 pgs).
Office Action for 10/974,139, mailed Oct. 9, 2007 (10 pgs).
Office Action for 10/976,425, mailed Mar. 26, 2007 (7 pgs).
Office Action for 10/976,425, mailed Sep. 26, 2007 (6 pgs).
Office Action for 11/172,544, mailed Dec. 15, 2006 (12 pgs.).
Office Action for 11/172,544, mailed Apr. 19, 2007 (10 pgs).
Office Action for 11/172,544, mailed Oct. 10, 2007 (10 pgs).
PCT International Search Report dated Nov. 4, 2005, PCT-US2005/022356, filed Jun. 23, 2005.
PCT International Search Report and Written Opinion dated May 8, 2006, PCT-US2005/037626 (9 pages).
Article on the web on Answers.com about different ceramic material from Wikipedia <http:--www.answers.com-topic-ceramics?cat=technology> (7 pages).
Imanaka, Yoshihiko et al., "Decoupling Capacitor with Low Inductance for High-Frequency Digital Applications," Fujitsu Sci. Tech. J., 38, Jun. 1, 2002, pp. 22-30.
Nagata, Hirotoshi et al., "Improvement of Bonding Strength Between Au-Ti and SiO2 Films by Si Layer Insertion," J. Vac. Sci. Technol. A 17(3), May-Jun. 1999, pp. 1018-1023.
Ohly, C. et al., "Defects in Alkaline Earth Titanate Thin Films—the Conduction Behavior of Doped BST," Integrated Ferroelectrics, 2001, 38, pp. 229-237.
Ohly, C. et al., "Electrical Conductivity and Segregation Effects of Doped SrTiO3 Thin Films," Journal of the European Ceramic Society, 2001, 21(10-11), pp. 1673-1676.
Ohly, C. et al., "High Temperature Conductivity Behavior of Doped SrTiO3 Thin Films," Integrated Ferroelectrics, 2001, 33, pp. 362-372.
Voisard, Cyril et al., "Electrical Conductivity of Strontium Bismuth Titanate under Controlled Oxygen Partial Pressure," Jour of the Euro Ceramic Society, 19, 1999, pp. 1251-1254.
Yoo, Han-III et al., "Defect Structure and Chemical Diffusion in BaTiO3," Solid State Ionics 135, 2000, pp. 619-623.

Felten, .J., et al.: Embedded Ceramic Resistors and Capacitors in PWB: Process and Performance; http:--edc.ncms.org- (2004) 7 pages.

Offerman, SE, et al.: Grain Nucleation and Growth During Phase Transformations; Science (2002) 298-1003-1005.

PCT International Search Report and Written Opinion dated Aug. 1, 2006, PCT-US2006/0012587 (12 pages).

Intel Corporation, "International Preliminary Report on Patentability (IPRP Chapter I) mailed Oct. 11, 2007", PCT/US2006/012587.

Intel Corporation, "International Preliminary Report on Patentability (IPRP Chapter I) mailed Jan. 18, 2007", PCT/US2005/022356.

Intel Corporation, "International Preliminary Report on Patentability (IPRP Chapter I) mailed May 3, 2007", PCT/US2005/037626.

Intel Corporation, "Office Action mailed Aug. 14, 2006", U.S. Appl. No. 11/096,313, 10 pgs.

Intel Corporation, "Office Action mailed Feb. 20, 2007", U.S. Appl. No. 11/096,313, 4 pgs.

Intel Corporation, "Office Action mailed Jan. 25, 2008", U.S. Appl. No. 11/096,315, 24 pages.

Intel Corporation, "Office Action mailed Jan. 25, 2008", U.S. Appl. No. 11/096,315.

Intel Corporation, "Office Action mailed May 31, 2007", U.S. Appl. No. 11/096,313, 16 pgs.

Intel Corporation, "Office Action mailed Nov. 29, 2006", U.S. Appl. No. 11/096,313, 12 pgs.

Intel Corporation, "Office Action mailed Oct. 18, 2007", U.S. Appl. No. 11/096,313, 19 pages.

Office Action mailed Aug. 20, 2008 in U.S. Appl. No. 11/929,788.

Office Action mailed Jun. 12, 2008 in U.S. Appl. No. 10/976,425.

Written Opinion from the Australian Patent Office mailed Jun. 4, 2008 in Singapore Application No. SG 200702414-4.

Intel Corporation, Final Office Action mailed Jun. 20, 2008; U.S. Appl. No. 11/096,315.

Intel Corporation, Final Rejection mailed Aug. 25, 2008: Korean Patent application No. 10-2007-7007393.

Intel Corporation, Final Office Action mailed Sep. 19, 2008 for U.S. Appl. No. 10/882,745.

Intel Corporation, Non Final Office Action mailed Sep. 30, 2008; U.S. Appl. No. 11/096,315.

Intel Corporation, Japan Office Action mailed Jan. 6, 2009 for JP2007-518288.

Intel Corporation, Final Office Action mailed Jan. 30, 2009; U.S. Appl. No. 10/976,425.

Pontes, F. M., et al., "Dielectric properties and microstructure of $SrTiO_3/BaTiO_3$ multilayer thin films prepared by a chemical role", *Thin Solid Films*, 385, (2001), 260-265.

Intel Corporation, Non Final Office Action dated Jan. 27, 2009 for U.S. Appl. No. 11/096,685.

Intel Corporation, Final Office Action dated May 13, 2009 for U.S. Appl. No.11/096,315.

Intel Corporation, Non final office action dated Jun. 25, 2009 for U.S. Appl. No. 11/891,443.

* cited by examiner

ITFC WITH OPTIMIZED C(T)

CROSS REFERENCE TO RELATED APPLICATIONS

This application is a Divisional of U.S. application Ser. No. 11/096,313 filed on Mar. 31, 2005 now U.S. Pat. No. 7,375,412, entitled "iTFC WITH OPTIMIZED C(T)".

BACKGROUND OF THE INVENTION

Circuit structures and passive devices.

It is desirable to provide decoupling capacitance in a close proximity to an integrated circuit chip or die. The need for such capacitance increases as the switching speed and current requirements of chips or dies becomes higher. Thus, the need for a high number of passive components for high density integrated circuit chips or dies, the resultant increasing circuit density of printed wiring boards (PWB), and a trend to higher frequencies in the multi-gigaHertz range are among the factors combining to increase pressure on passive components surface-mounted on package substrates or PWBs. By incorporating embedded passive components (e.g., capacitors, resistors, inductors) into the package substrate or PWB, improved performance, better reliability, smaller footprint, and lower cost can be achieved.

Capacitors are the predominant passive component in most circuit designs. Typical materials for suitable embedded capacitor components, such as polymer and high-dielectric constant (high-k) ceramic powder composites or high-k ceramic powder and glass powder mixtures, are generally limited to a capacitance density on the order of nanoFarad/$cm^2$ and 0.1 microFarad/$cm^2$.

BRIEF DESCRIPTION OF THE SEVERAL VIEWS OF THE DRAWINGS

Features, aspects, and advantages of embodiments will become more thoroughly apparent from the following detailed description, appended claims, and accompanying drawings in which:

DETAILED DESCRIPTION OF THE INVENTION

Figure 1:
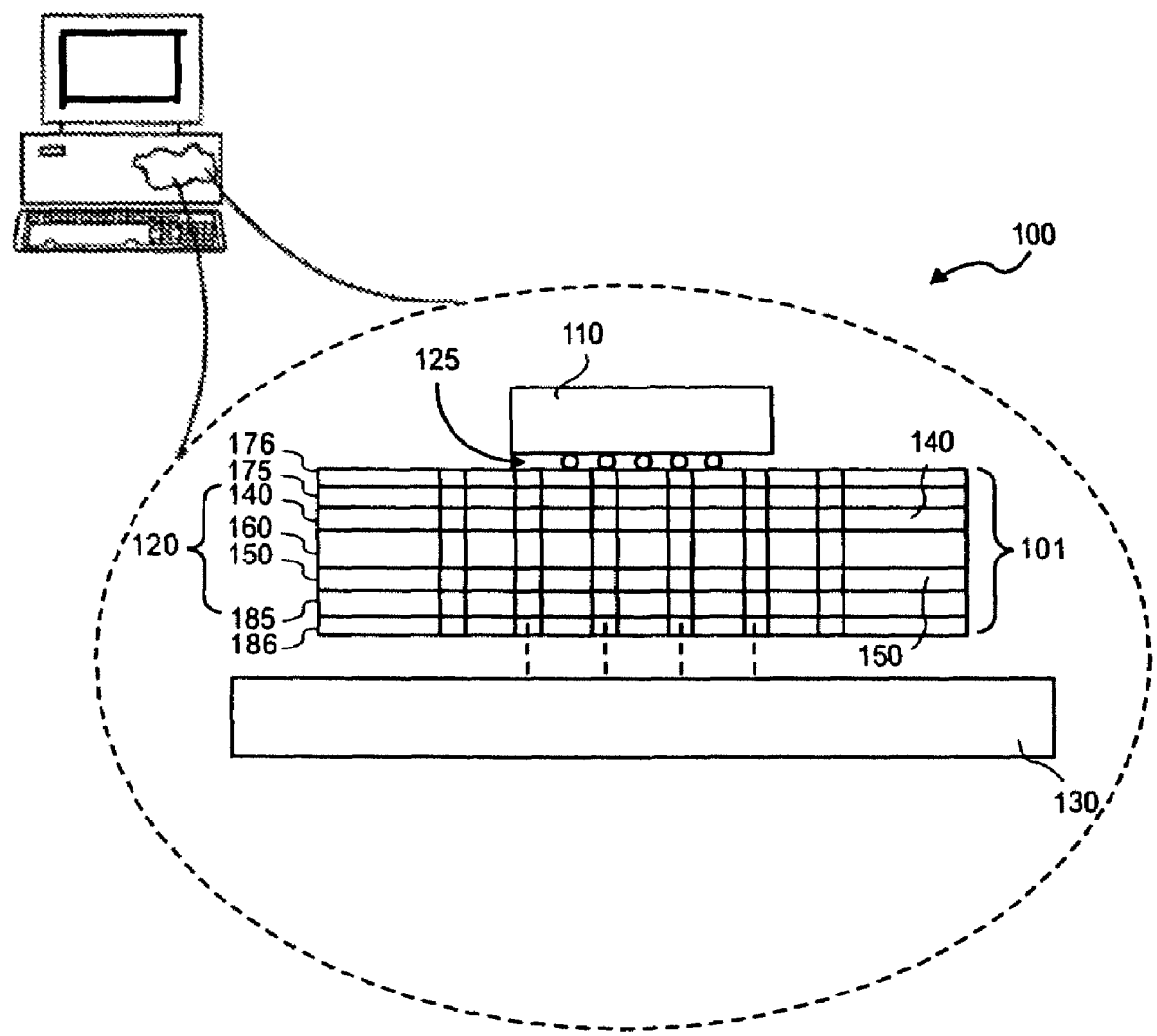
FIG. 1 shows a cross-sectional schematic side view of an embodiment of a chip or die package suitable for mounting on a printed circuit or wiring board.

FIG. 1 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanner, monitors, etc.), entertainment device (e.g., television, radio, stereo, tape and compact disc player, videocassette recorder, MP3 (Motion Picture Experts Group, Audio Layer 3) player, etc.), and the like. FIG. 1 illustrates the package as part of a desktop computer.

FIG. 1 shows electronic assembly 100 including die 110 physically and electrically connected to package substrate 101. Die 110 is an integrated circuit die, such as a processor die. Electrical contact points (e.g., contact pads on a surface of die 110) are connected to package substrate 101 through conductive bump layer 125. Package substrate 101 may be used to connect electronic assembly 100 to printed circuit board 130, such as a motherboard or other circuit board.

In one embodiment, package substrate 101 includes one or more capacitor structures. Referring to FIG. 1, package substrate 101 includes capacitor structure 140 and capacitor structure 150 embedded therein. Capacitor structure 140 and capacitor structure 150 are connected to opposite sides of core substrate 160. In another embodiment, capacitor structure 140 and capacitor 150 may be stacked one on top of the other.

In one embodiment, core substrate 160 is an organic core such as an epoxy including a fiberglass reinforced material, also called pre-preg. This configuration may be referred to as an integrated thin film capacitor (iTFC) system, where the capacitor(s) is(are) integrated into the package substrate rather than, for example, an interposer between the die and the package substrate. Overlying capacitor structure 140 is adhesion layer 175 (e.g., silica-filled epoxy). Underlying capacitor structure 150 is adhesion layer 185. Overlying adhesion layer 175 is build-up layer 176. Underlying adhesion layer 185 is build-up layer 186. Adhesion layer 175 and adhesion layer 185 act as adhesion layers to the overlying and underlying build-up layers 176 and 186, respectively. Each build-up layer includes traces (e.g., copper traces) for lateral translation of contact points between die 110 and package substrate 101, and package substrate 101 and printed circuit board 130, respectively and typically solder resist as a top layer. The region made up of the combination of layers, 185, 150, 160, 140 and 175, is referred to herein as functional core 120.

Figure 2:
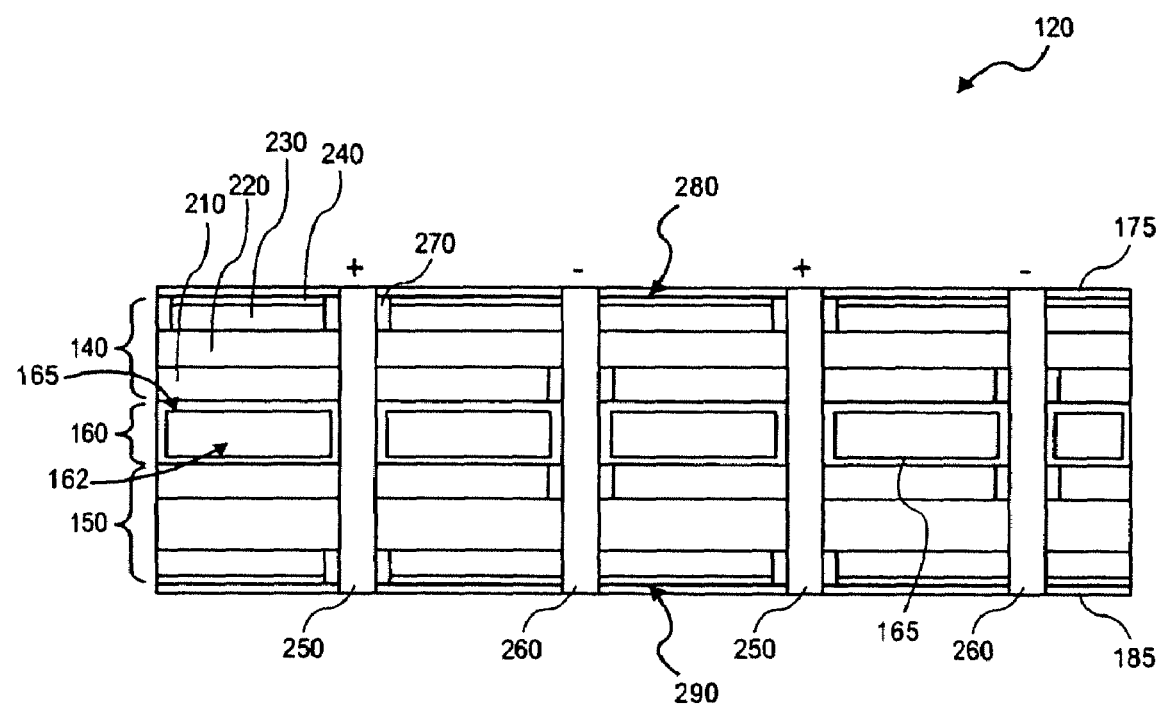
FIG. 2 shows a cross-sectional schematic side view of the package substrate of FIG. 1.

FIG. 2 shows a magnified view of a portion of functional core 120. Functional core 120 includes core substrate 160 having a thickness, in one embodiment, on the order of 200 microns (μm) to 700 μm. In another embodiment, core substrate 160 has a thickness on the order of 200 μm to 300 μm. In one embodiment, core substrate 160 includes core 162, such as a glass-fiber reinforced epoxy, and shell 165, such as a silica-particle filled epoxy.

Capacitor structure 140 is connected to one side of core substrate 160 (a top side as viewed). Capacitor structure 140 includes first conductor 210 proximal to core substrate 160 and second conductor 230. Disposed between first conductor 210 and second conductor 230 is dielectric material 220. Capacitor structure 150 is connected to an opposite side of core substrate 160 (a bottom side as viewed) and has a similar configuration of a dielectric material disposed between two conductors. Overlying capacitor structure 140 and capacitor structure 150 of functional core 120 (on sides opposite sides facing core substrate 160) is adhesion layer 175 and adhesion layer 185, respectively, made of, for example, an organic material and having a representative thickness on the order of 10 microns (μm) to 50 μm. Build-up layer 176 and build-up layer 186 of FIG. 1 would be deposited on these adhesion layers. As noted above, the build-up layers may include traces and contact points to connect package substrate to a chip or die and to a printed circuit board, respectively, and solder resist as a top layer.

In one embodiment, first conductor 210 and second conductor 230 of capacitor structure 140 are electrically conductive material. Suitable materials include, but are not limited to, a nickel or a copper material. In one embodiment, dielectric material 220 is a ceramic material having a relatively high dielectric constant (high-k). Suitable materials for dielectric material 220 include, but are not limited to, barium titanate ($BaTiO_3$), barium strontium titanate (($Ba, Sr$) $TiO_3$), and strontium titanate ($SrTiO_3$).

In one embodiment, capacitor structure 140 includes first conductor 210 and second conductor 220 having a thickness on the order of 20 μm to 50 μm, and dielectric material 220 of a high-k ceramic material of a thickness on the order of 1 μm to 3 μm and, in another embodiment, less than 1 μm. Capacitor structure 150, in one embodiment, is similar to capacitor structure 140.

In the embodiment of functional core 120 shown in FIG. 2, capacitor structure 140 includes overlayer 240 on second conductor 230. Overlayer 240 is an optional electrically conductive layer that may be used in an instance where second conductor 230 is a material that may not be compatible or may be less compatible with materials or processing operations to which functional core 120 may be exposed. For example, in one embodiment, second conductor 230 is a nickel material. To render functional core 120 transparent to subsequent processing operations or compatible with materials to which functional core 120 may be exposed, overlayer 240 is a copper material. Representatively, overlayer 240, if present, may have a thickness on the order of a few microns.

FIG. 2 shows a number of conductive vias extending through functional core 120 between surface 280 and surface 290. Representatively, conductive via 250 and conductive via 260 are electrically conductive materials (e.g., copper or silver) of suitable polarity to be connected to power or ground contact points of die 110 (e.g., through conductive bump layer 125 to contact pads on die 110 of FIG. 1). In this manner, conductive via 250 and conductive via 260 extend through capacitor structure 140, core substrate 160, and capacitor structure 150. Conductive vias 250 and 260 may be insulated, where desired, from portions of capacitor structure 140 or capacitor structure 150 by sleeves 270 of a dielectric material.

Figure 3:
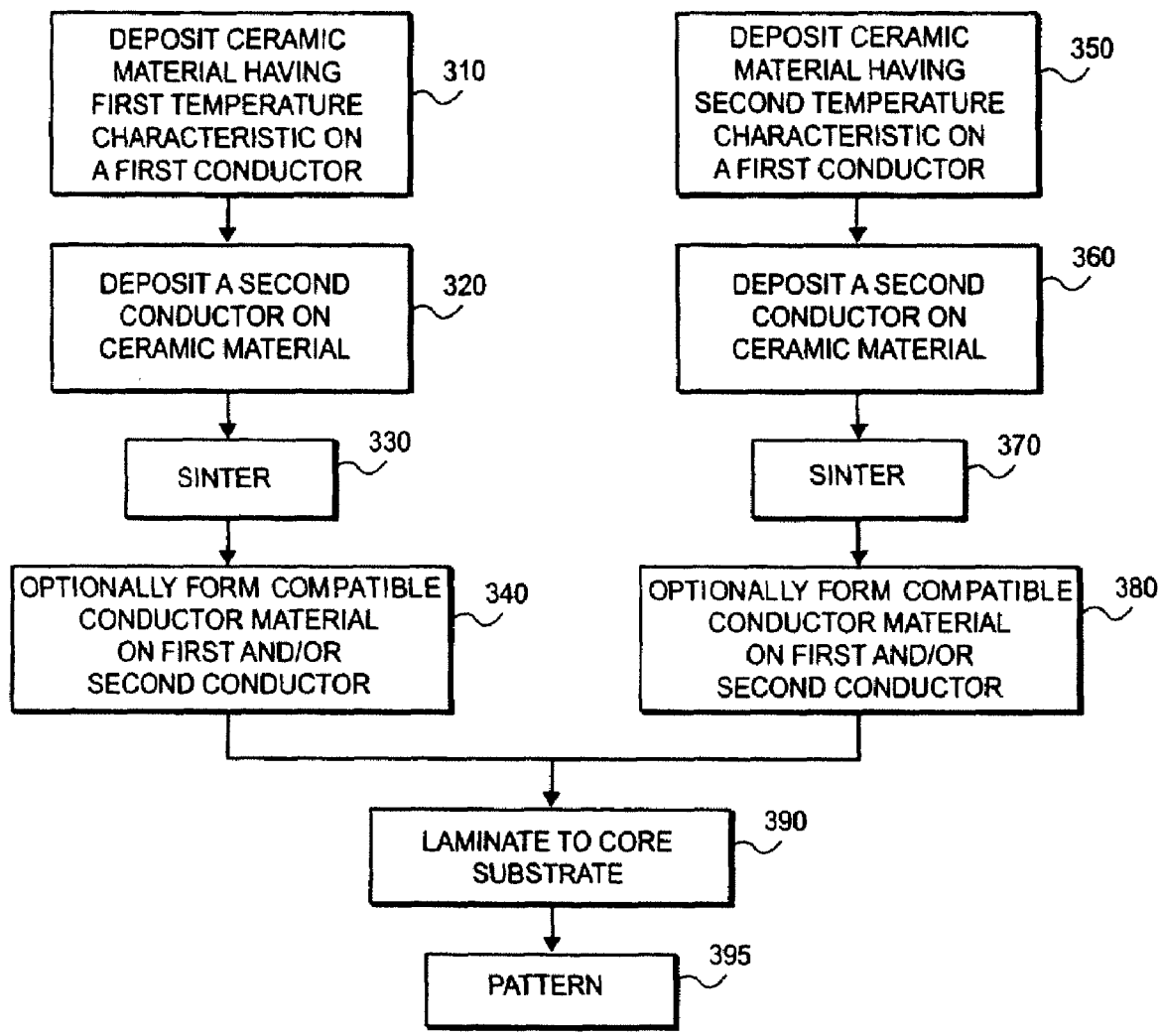
FIG. 3 describes a process flow for forming a capacitor.

FIG. 3 presents a process for forming a portion of a package substrate including a core substrate such as core substrate 160 and capacitor structures, such as capacitor structure 140 and capacitor structure 150, on opposite sides of the core substrate. Specifically, FIG. 3 presents a process for forming a portion of a package substrate having capacitors with different ceramic material, selected, in one embodiment, based on the temperature characteristic of the ceramic material. A capacitor structure, such as capacitor structure 140 and/or capacitor structure 150 may be formed and then separately connected to core substrate 160. FIGS. 4-9 show formation processes in connection with portions of the process flow described in FIG. 3.

In one embodiment, ceramic formulations for use in a capacitor structure have a generally stable temperature characteristic. Temperature characteristics are designated by the Electronics Industries Association (EIA). For class II and class III dielectrics (including X7R, X5R, ZFU and Y5V), the first symbol indicates the lower limit of the operating temperature range, the second indicates the upper limit of the operating temperature range, and the third indicates the maximum capacitance change allowed over the operating temperature range. EIA type designation codes for class II and class III dielectrics are shown in Table 1.

TABLE 1

EIA Temperature Characteristic Codes for Class II & III Dielectrics

| Low Temperature Rating | | High Temperature Rating | | Maximum Capacitance Shift | | |
|---|---|---|---|---|---|---|
| Degree Celsius | Letter Symbol | Degree Celsius | Number Symbol | Percent | Letter Symbol | EIA Class |
| +10 C. | Z | +45 C. | 2 | ±1.0% | A | II |
| −30 C. | Y | +65 C. | 4 | ±1.5% | B | II |
| −55 C. | X | +85 C. | 5 | ±2.2% | C | II |
| | | +105 C. | 6 | ±3.3% | D | II |
| | | +125 C. | 7 | ±4.7% | E | II |
| | | +150 C. | 8 | ±7.5% | F | II |
| | | +200 C. | 9 | ±10.0% | P | II |
| | | | | ±15.0% | R | II |
| | | | | ±22.0% | S | III |
| | | | | +22/−33% | T | III |
| | | | | +22/−56% | U | III |
| | | | | +22/−82% | V | III |

Figure 4:
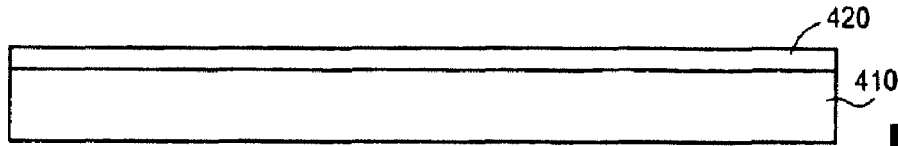
FIG. 4 shows a schematic side view of a first conductor sheet having a dielectric material having a first temperature characteristic deposited thereon.

FIG. 4 shows structure 425 of a first conductor 410 of, for example, a nickel sheet or foil possibly having a layer of nickel paste on a surface of first conductor 410 (a top surface as viewed). In one embodiment, a nickel paste will have ceramic powder (e.g., barium titanate) additions in order to provide an adhesion layer between the underlying nickel foil and the soon-to-be-deposited overlying X7R (or X7S or any other temperature appropriate for the application) ceramic green sheet. In one embodiment, a first conductor 410 will be made of Ni green sheet, which will have ceramic powder (e.g., barium titanate) additions in order to provide an adhesion to the soon-to-be-deposited overlying X7R (or X7S or any other temperature appropriate for the application) ceramic green sheet.

FIG. 4 shows structure 425 of ceramic layer 420 of an X7R (or X7S or any other temperature appropriate for the application) ceramic green sheet deposited on first conductor 410 (block 310). Ceramic layer 420 or green sheet, in one embodiment, is laminated on an underlying nickel paste layer. In one embodiment, a X7R dielectric is selected having an operating temperature range of −55° C. to +125° C. rating and a dielectric constant, k, on the order of 3,000. This material may be selected because it has a generally stable temperature characteristic ($C_{room\ temperature}$ ±10-15%). One reason for the selection of a X7R dielectric is that the capacitor structure being formed will be positioned on a die side of a package substrate where the capacitor structure may be exposed to high temperatures (e.g., greater than 100° C.).

Figure 5:
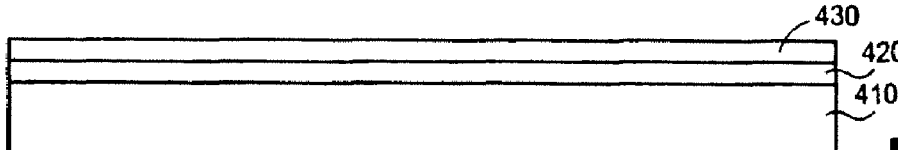
FIG. 5 shows the structure of FIG. 4 following the formation of a second conductor on the dielectric layer opposite the first conductor.

Referring to FIG. 3, following the deposition of a ceramic material, a second conductor is deposited on the ceramic material (block 320). FIG. 5 shows structure 435 similar to structure 425 in FIG. 4, including second conductor (e.g., a nickel sheet or foil) 430 having, for example, a layer of nickel past formed thereon. Nickel foil 430 is laminated on top (as viewed) of structure 425 in order to form structure 435 in FIG. 5. In one embodiment, a first conductor 410 will be made of Ni green sheet, which will have ceramic powder (e.g., barium titanate) additions in order to provide an adhesion to the underlying X7R (or X7S or any other temperature appropriate for the application) ceramic green sheet. In one embodiment, following lamination, structure 435 is thermally treated to burn-off organic contents. Representatively, a thermal treatment would involve a temperature range of 300 to 500° C. for a duration of between two hours and a day.

Referring again to FIG. 3, following the formation of a dielectric material between conductor materials, the composite structure is subsequently heat-treated in a reducing atmosphere in order to densify (e.g., reduce the surface energy of) the green sheet and nickel paste layers simultaneously (block 330). Once the heat treatment is completed, the product will have sufficient strength for packaging and handling purposes, and will have a sufficiently dense microstructure.

Figure 6:
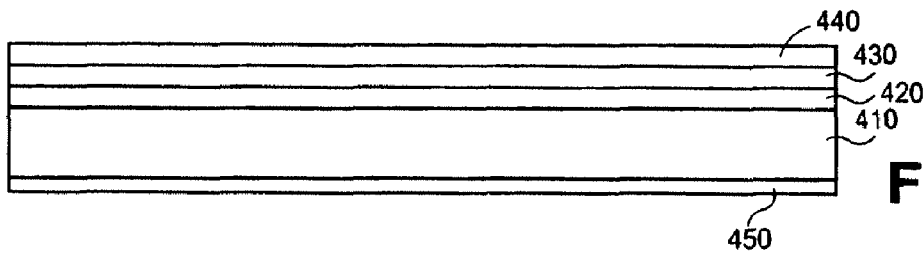
FIG. 6 shows the structure of FIG. 5 following the formation of a different conductive material on exposed surfaces of the first conductor and second conductor.

Following heat treatment, the method of FIG. 3 provides, as an optional operation, that one or both of an exposed surface of the first conductor and the second conductor are coated with a different electrically conductive material (block 340). FIG. 6 shows structure 445 where two copper layers have been deposited on top and bottom surfaces of structure 445, respectively. Copper layer 440 and copper layer 450 are deposited, in one embodiment, through electroless deposition followed by subsequent depositions on respective surfaces of copper by electroplating to form copper layer 440 and copper layer 450. Copper layer 440 and copper layer 450 may have a thickness on the order of a few microns. Alternatively, a copper layer may be formed by depositing a copper paste including copper particles and sintering the paste.

Copper coating may be desirable to make the capacitor structure transparent to subsequent processing operations to which the capacitor structure or a package substrate may be exposed. In the example where first conductor 410 and second conductor 430 are a nickel material, for example, it may be desirable to coat an exposed surface of the first or second conductor with a copper material.

Referring again to FIG. 3, at the same time, before or after the formation of structure 445 (e.g., a capacitor structure), a second capacitor structure may be formed. The second capacitor structure would be used in the formation of the same package substrate. The second capacitor structure, however, may use a dielectric material (e.g., a ceramic material) having a less stable temperature characteristic than the dielectric material used in the formation of structure 445. In one embodiment, a dielectric material has a less stable temperature characteristic and a higher dielectric constant. Referring to Table 1, in one embodiment, a suitable dielectric material is a Y5V dielectric having a temperature rating of −25° C. to +80° C. and a dielectric constant on the order of about 20,000. Representatively, a capacitor structure formed with a Y5V dielectric material may be placed opposite the die side of a package substrate.

Figure 7:
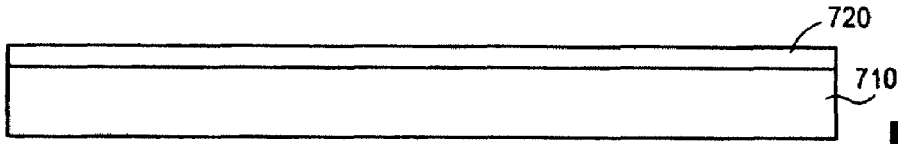
FIG. 7 shows a schematic side view of a first conductor sheet having a dielectric material having a second temperature characteristic deposited thereon.

In one embodiment of forming a capacitor structure, the processing operations described with reference blocks 310-340 may be followed. A sheet (e.g., foil) of a first conductor material having a representative thickness on the order of several microns to tens of micron, is provided as an initial substrate. A ceramic material may be deposited to a thickness on the order of one micron or less onto the first conductor (block 350). FIG. 7 shows structure 725 made up of first conductor 710, for example, of a nickel sheet or foil possibly having a layer of nickel paste on a surface of first conductor 710 (a top surface as viewed). In one embodiment, a nickel paste layer will have ceramic powder (e.g., barium titanate) additions in order to provide an adhesion layer between the underlying nickel foil and the soon-to-be-deposited overlying Y5V green sheet. In one embodiment, a first conductor 710 will be made of Ni green sheet, which will have ceramic powder (e.g., barium titanate) additions in order to provide an adhesion to the soon-to-be-deposited overlying Y5V ceramic green sheet.

FIG. 7 shows structure 425 with ceramic layer 720 of a Y5V green sheet deposited on first conductor 710. Ceramic layer 720 or green sheet, in one embodiment, is laminated on an underlying nickel paste layer.

Figure 8:
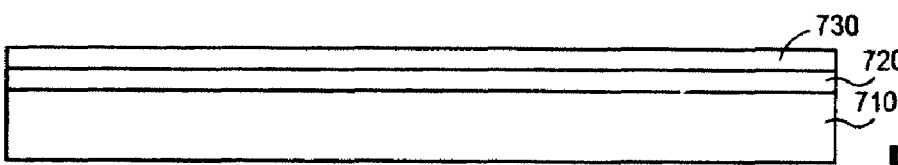
FIG. 8 shows the structure of FIG. 7 following the formation of a second conductor on the dielectric layer opposite the first conductor.

Referring again to FIG. 3, following the deposition of ceramic material on a first conductor, a second conductor is deposited (block 360). FIG. 8 shows structure 735 similar to structure 725 of FIG. 4 having a nickel paste-nickel foil second conductor 730 laminated on top (as viewed) of structure 725 in order to form structure 735 in FIG. 8. In one embodiment, following lamination, structure 735 is thermally treated to burn-off organic contents. Representatively, a thermal treatment would involve a temperature range of 300 to 500° C. for a duration of between two hours and a day.

Figure 9:
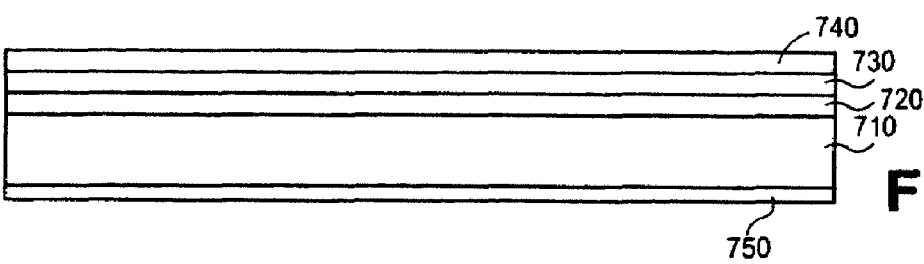
FIG. 9 shows the structure of FIG. 8 following the formation of a different conductive material on exposed surfaces of the first conductor and second conductor.

Referring again to FIG. 3, following the formation of a dielectric material between conductor materials, the composite structure (structure 735) is subsequently heat-treated in a reducing atmosphere in order to densify the ceramic green sheet and optional nickel paste layers simultaneously (block 370). Following heat treatment, the method of FIG. 3 provides, as an optional operation, that one or both of first conductor 710 and second conductor 730 are coated with a different electrically conductive material (block 380). FIG. 9 shows structure 745 having copper layer 740 and copper layer 750 deposited on top and bottom surfaces of the structure 745, respectively. Copper layer 740 and copper layer 750 may be deposited, in one embodiment, through electroless deposition followed by electroplating through a thickness on the order of a few microns.

Referring to the method of FIG. 3, capacitor structure 445 (FIG. 6) and capacitor structure 745 (FIG. 9) may be attached to a core substrate, such as an organic core substrate as discussed above (block 390). In the example where a copper layer overlays a conductor, the copper surface may need to be roughened (e.g., by etching) in order to enhance lamination. Even in the case where there is no overlaying copper layer, the conductor surfaces may need to be roughened (e.g., by etching) in order to enhance lamination.

Figure 10:
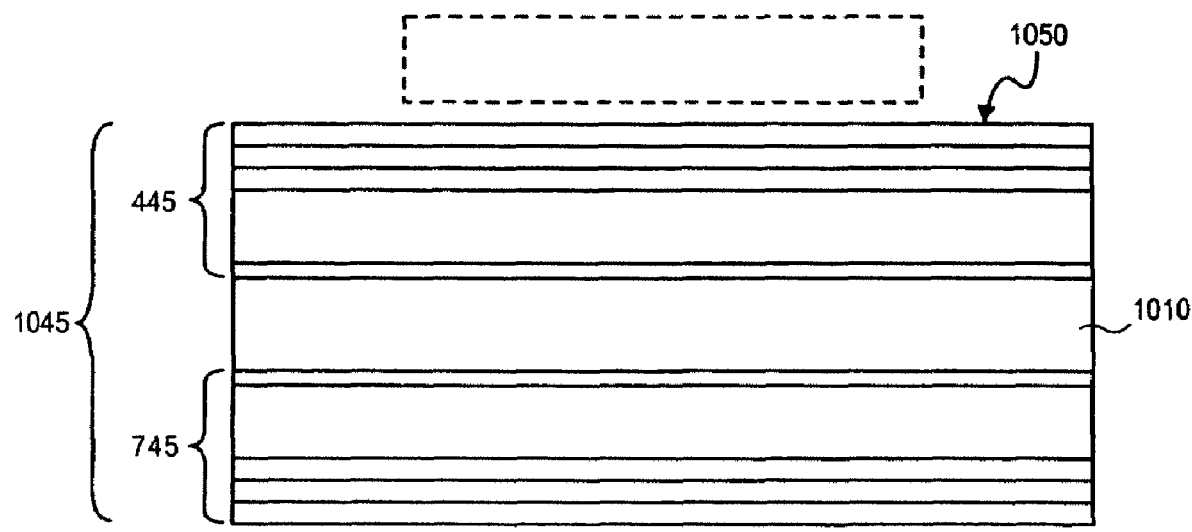
FIG. 10 shows a cross-sectional schematic side view of a package substrate including a core substrate with a structure of FIG. 6 and the structure of FIG. 7 connected to opposite sides thereof.

FIG. 10 shows structure 1045 including core substrate 1010 having structure 445 (capacitor structure) and structure 745 (capacitor structure) laminated to opposite sides of core structure 1010. Following laminating of the capacitor structures to a core substrate to form package substrate 1045, the package substrate may be patterned (block 360, FIG. 3). Conventional patterning operations, such as mechanical drilling, drilling via holes in epoxy with laser, lithography and copper plating operations used in via formation may be employed. Each capacitor structure may also be patterned to form individual capacitors. A complete package substrate may further include build-up layers of an organic material (e.g., epoxy or glass particle-filled epoxy) onto the substrate.

Referring to the orientation shown in FIG. 10, the package substrate is provided with structure 445 having a ceramic material with a more stable temperature characteristic on a die side of the package substrate. FIG. 10 shows package substrate 1045 having die side 1050. In one embodiment, structure 445 of a capacitor including an X7R ceramic material is formed on die side 1050. The X7R should provide a flat temperature response with respect to the dielectric constant at room temperature. Because of its temperature stability, the capacitor should provide sufficient charge at a relatively low loop inductance, relative to the capacitor structure 745, making it suitable for first droop uses. However, the dielectric constant, k, of structure 445 may not be as high as desired. The capacitor of structure 745, alternatively, is selected, in one embodiment, to provide high capacitance at lower temperature, since the lower portion of the substrate would be running colder than the top portion which is closer to the heat generating silicon die. In this case, structure 745 is suitable for second droop operation where high inductance is not as critical. Because structure 745 utilizes a ceramic material with a relatively high dielectric constant, the overall capacitance of the package substrate (structure 445 plus structure 745) is high.

In the above embodiment, package substrate 1045 included a single capacitor structure on opposing sides of the package. In another embodiment, multiple capacitor structures may be placed on one or more sides, such as placing multiple capacitor structures using a dielectric material having a stable temperature characteristic (e.g., $C_{room\ temperature} \pm 10\text{-}15\%$) on die side 1050 of the package substrate.

Figure 11:
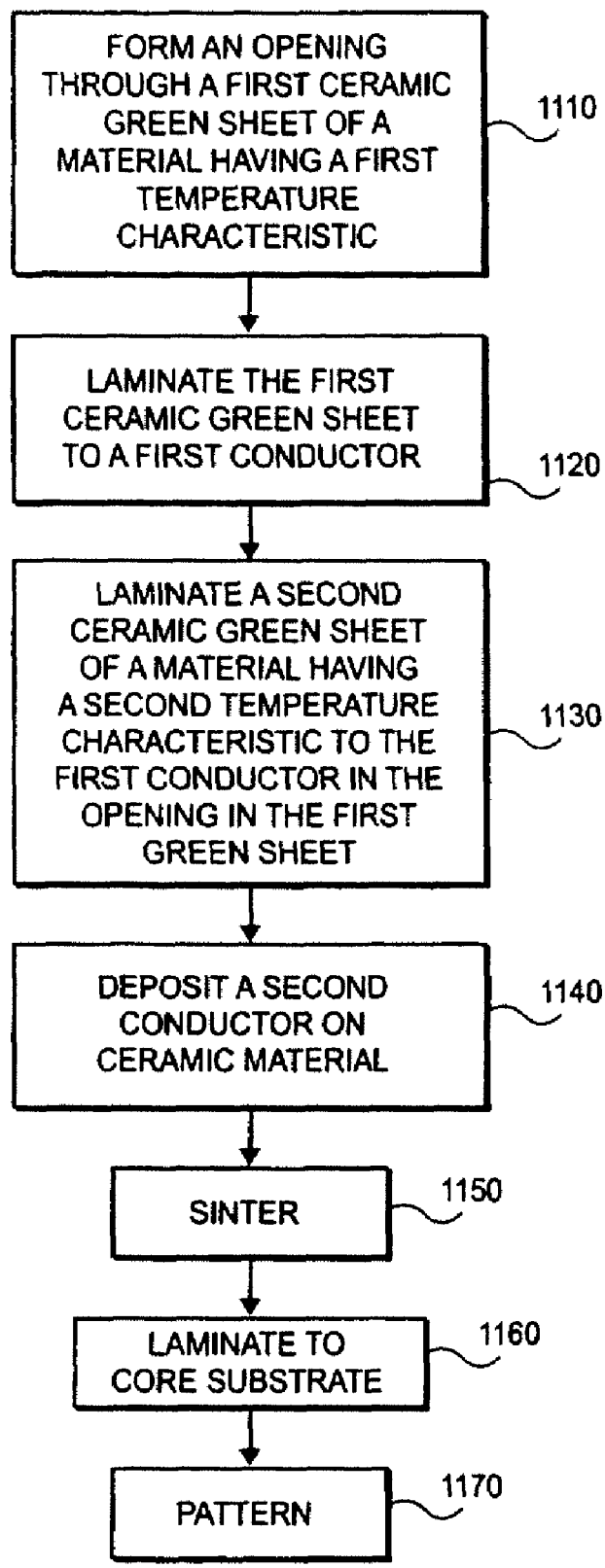
FIG. 11 describes a second process flow performing a capacitor.

FIG. 11 presents a second process of forming a package substrate, such as package substrate 120. This process describes in particular the formation of capacitor structure 140 on a die side of package substrate 120. FIGS. 12-17 show formation processes in connection with portion of the process flow described in FIG. 11, notably in the embodiment of forming a capacitor structure.

Figure 12:
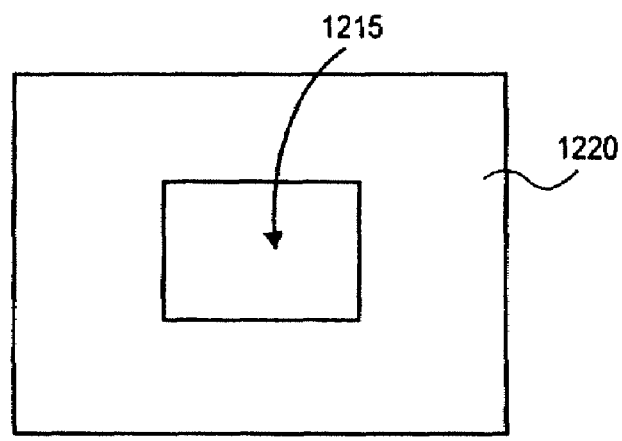
FIG. 12 shows a schematic top view of a ceramic green sheet having an opening formed therein.

Referring to FIG. 11, in one embodiment of forming a capacitor structure of a package substrate, a green sheet of a ceramic material is provided and an opening is made through the ceramic green sheet in an area corresponding to an area predicted to be under the die shadow of a package (block 1110). In one embodiment, a ceramic green sheet may be selected of a material that has a generally lower steady state operating temperature and a high dielectric constant. Referring to Table 1, a suitable material for the ceramic green sheet is a ceramic classified as Y5V, having a temperature rating of −25° C. to +80° C. and a dielectric constant on the order of 20,000. The lower steady state operating temperature of the material makes such material suitable for capacitance applications outside the die shadow where the temperature conditions generally will not exceed the temperature rating. FIG. 12 shows ceramic layer or green sheet 1220 having a rectangular form with rectangular opening 1215 formed therein. Opening 1215 is selected to be of a size, in one embodiment, such that an exposure of a material for ceramic layer 1220 to temperatures outside its maximum operating temperature range is minimized. In one embodiment, opening 1215 is formed in a portion of layer 1220 corresponding with a projected die shadow of a package. One way to form opening 1215 in ceramic layer 1220 is through mechanical punching, laser or lithographic etching.

Figure 13:
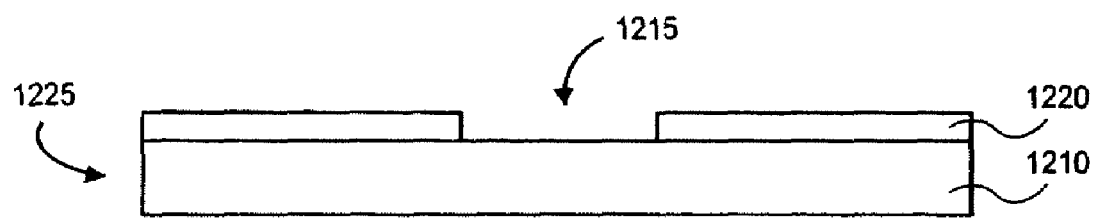
FIG. 13 shows a cross-sectional schematic side view of a first conductor having the ceramic green sheet of FIG. 12 connected to one side thereof.

Referring to FIG. 11, following the formation of an opening through a ceramic green sheet of a material having a first temperature characteristic, the green sheet is laminated to a first conductor (block 1120). In one embodiment, the substrate is a sheet (e.g., foil) of a first conductor material having a representative thickness on the order of several microns to tens of microns is provided. FIG. 13 shows structure 1225 made up of first conductor 1210 of, for example, a nickel green sheet, or a nickel sheet of foil possibly having a layer of nickel paste on a surface of first conductor 1210 (a top surface as viewed). In one embodiment, a nickel paste layer will have ceramic powder (e.g., barium titanate) additions in order to provide an adhesion layer between the underlying nickel foil and the soon-to-be-deposited overlying Y5V green sheet. In one embodiment, a first conductor 710 will be made of Ni green sheet, which will have ceramic powder (e.g., barium titanate) additions in order to provide an adhesion to the soon-to-be-deposited overlying Y5V ceramic green sheet. FIG. 13 shows structure 1225 with ceramic layer 1220 of a Y5V green sheet deposited on first conductor 1210. FIG. 13 is a cross sectional side view through structure 1225 to illustrate opening 1215 in ceramic layer 1220.

Referring to FIG. 11, following the lamination of ceramic layer 1220 on first conductor 1210, a second ceramic material is laminated to the first conductor in the opening in the first ceramic layer (block 1130). The second ceramic material may be selected of a material having a higher temperature rating (e.g., a stable temperature characteristic ($C_{room\ temperature} \pm 10\text{-}15\%$)) suitable for use with temperature conditions typically experienced under a die shadow. Referring to Table 1, one suitable ceramic material is an X7R dielectric having a temperature range of −55° C. to 125° C. and a dielectric constant on the order of about 3,000. The ceramic material with the high temperature rating may be patterned to fit within opening 1215 (see FIG. 12 or FIG. 13) through mechanical punching, laser or lithographic etching.

Figure 14:
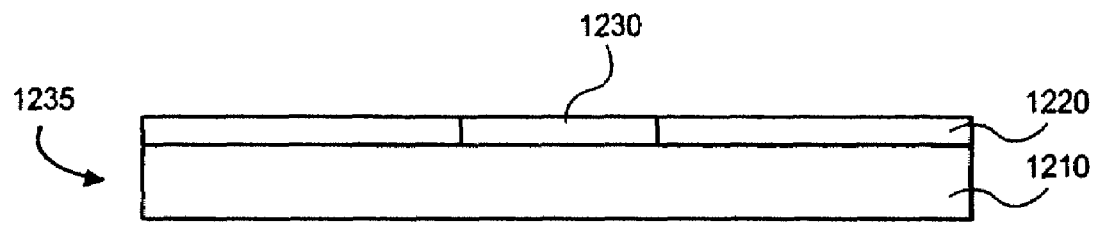
FIG. 14 shows the structure of FIG. 13 following the introduction of a second ceramic material in the opening formed in the first ceramic material.
Figure 15:
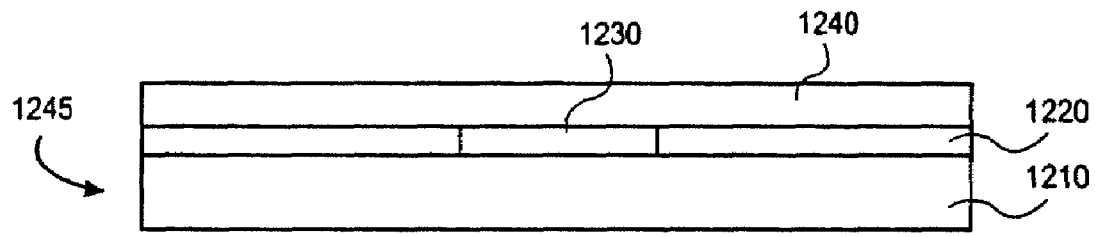
FIG. 15 shows the structure of FIG. 14 following the connection of a second conductor to the dielectric layer (composite ceramic materials) opposite the first conductor.

FIG. 14 shows structure 1235 including first conductor 1210 and ceramic layer 1220. Structure 1235 also includes ceramic layer segment 1230 laminated to first conductor 1210 in opening 1215 (see FIG. 13) of a ceramic material having a relatively high temperature rating. In one embodiment, following lamination, a second conductor is deposited on structure 1235 on the composite dielectric layer (block 1140). FIG. 15 shows structure 1245 including second conductor (e.g., a nickel sheet or foil or nickel green sheet) 1240 laminated (possibly with a nickel paste between the conductor and the ceramic material) to dielectric layer 1220 and dielectric layer

1230. In one embodiment, following lamination, structure 1245 is thermally treated to burn-off organic contents. Representatively, a thermal treatment would involve a temperature range of 300 to 500° C. for a duration of between two hours and a day.

Referring again to FIG. 11, following the formation of a composite dielectric material between conductor materials, the structure is subsequently heat-treated in a reducing atmosphere in order to densify the dielectric and nickel paste layers simultaneously (block 1150).

Figure 16:
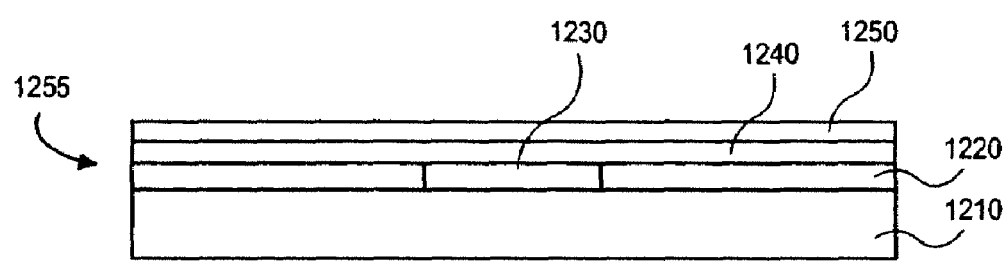
FIG. 16 shows the structure of FIG. 15 following the introduction of a different conductive material on exposed surfaces of the first conductor and the second conductor.
Figure 17:
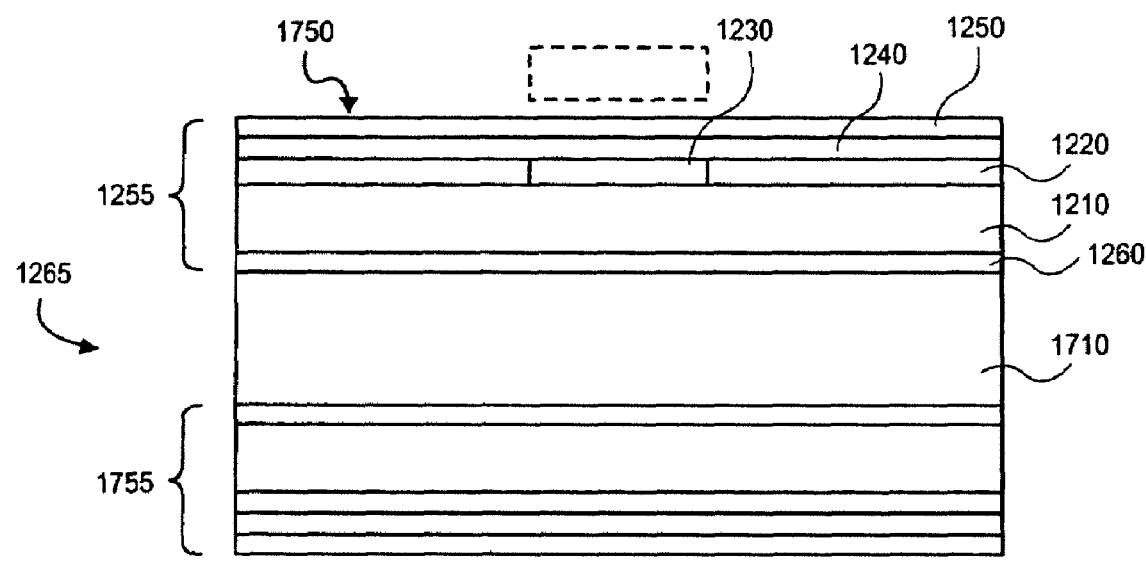
FIG. 17 shows a package substrate including a core and the structure of FIG. 16 coupled to a die side of the core.

FIG. 16 shows structure 1255 following the optional coating of first conductor 1210 and second conductor 1240 with a different electrically conductive material. In the example where first conductor 1210 and second conductor 1240 are a nickel material, the nickel material may be coated with a copper material. FIG. 17 shows copper layer 1250 overlying second conductor 1240 and copper layer 1260 underlying first conductor 1210. Copper layer 1250 and copper layer 1260 may be deposited, for example, using a combination of electroless and electroplating techniques or by depositing a copper paste including copper particles and sintering the paste.

Referring again to FIG. 11, the capacitor structure (structure 1255 of FIG. 16), may be attached to a core substrate, such as an organic core substrate as discussed above (block 1160). In the example where a copper layer overlays a conductor, the copper surface may need to be roughened in order to enhance lamination. Even in the case where there is no overlaying copper layer, the conductor surfaces may need to be roughened (e.g., by etching) in order to enhance lamination. The capacitor structure may be attached to one surface of a base substrate. FIG. 17 shows structure 1255 coupled to core substrate 1710. Structure 1255 is coupled to die side 1750 of core substrate 1710. A second capacitor structure (capacitor structure 1755) may be connected to an opposite side of core substrate 1710. The package substrate could then be patterned according to techniques such as described above with reference to block 395 of FIG. 3 (block 1170).

As shown in FIG. 17, dielectric layer 1230 having, in one embodiment, a relatively high temperature rating, is positioned so that it includes an area under a projected die shadow. It is appreciated, that the dimensions (length and width) of dielectric layer 1230 may extend beyond projected die shadow or be within a projected die shadow depending, for example, on desired operating conditions and overall capacitance of the package substrate. In an embodiment where a second capacitor structure (structure 1755) is laminated to an opposite side of core substrate 1710, the capacitor structure may be formed with a dielectric material having a generally lower steady state operating temperature (due to its remote location relative to an operating die) and a high capacitance. One suitable dielectric material would be a Y5V material.

Figure 18:
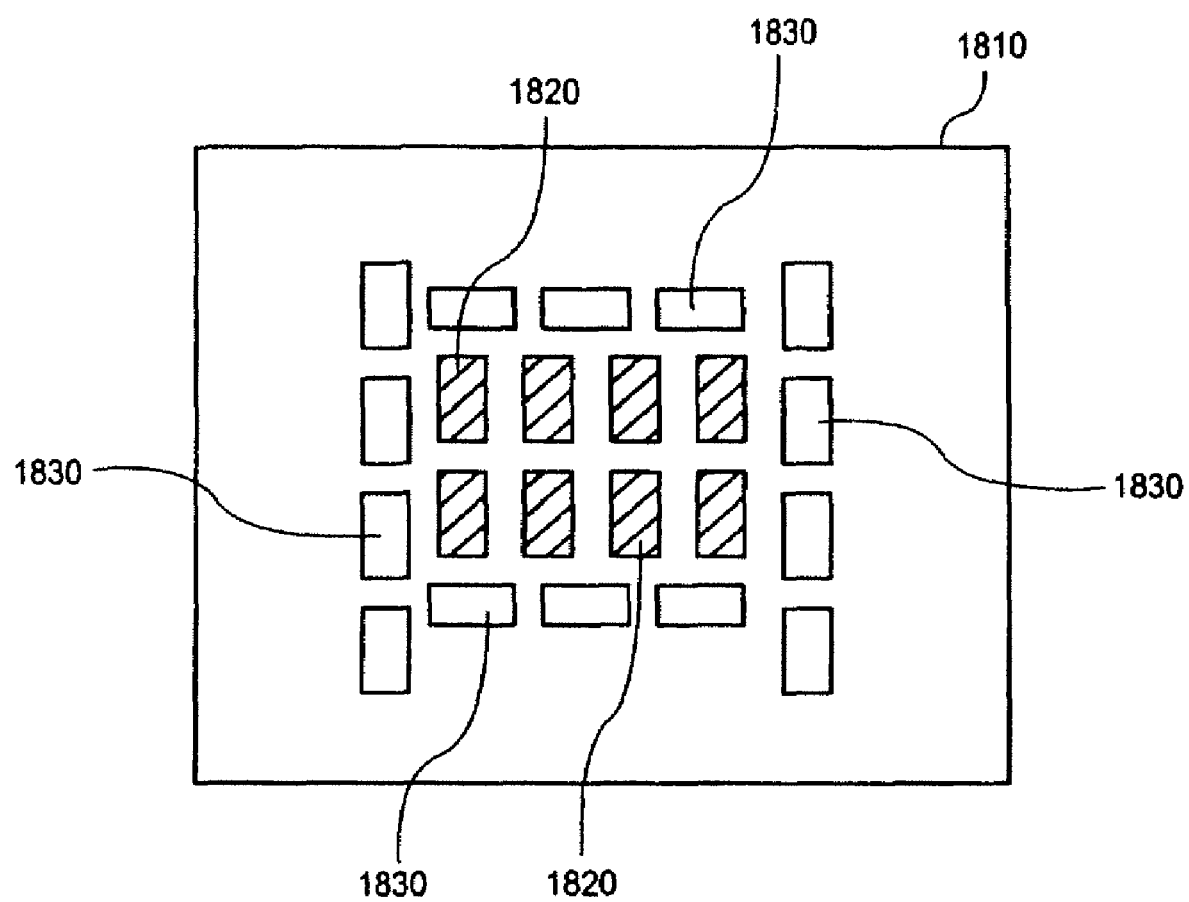
FIG. 18 shows a schematic top view of a package substrate having capacitors formed of dielectric material with different temperature rating.

The embodiment described with reference to FIGS. 11-17 recognizes that in operation, the temperature on a package is not uniform. Thus, in one embodiment of constructing a package, capacitors with a higher temperature rating (typically lower capacitance) are only needed in the hottest spots. In another embodiment, capacitors with different ratings are used at different spots on a package. In this manner, more capacitance can be placed on a package because lower temperature ratings typically lead to a higher average capacitance. Furthermore, capacitors with higher temperature ratings tend to cost more than capacitors with lower temperature rating. Thus, the total cost of power delivery can be brought down with a selection of capacitors with different temperature ratings. FIG. 18 shows one embodiment of a package having two different capacitors, one with a higher temperature rating than the other. Temperature ratings of dielectric materials of capacitor structures may be determined, for example, by the characteristic codes set forth in Table 1 above. In one embodiment, capacitors 1820 of package 1810 use an X7R dielectric material (125° C., ±15 percent) for areas of package 1810 that are predicted to see high temperatures and capacitors 1830 use an X5R dielectric material (85° C., ±15 percent) in areas predicted to see a lesser temperature. By using X7R-rated capacitors only in areas predicted to see high temperatures (e.g., under a die shadow) and X5R-rated capacitors in cooler locations, the overall capacitance of package 1810 may be increased.

Figure 19:
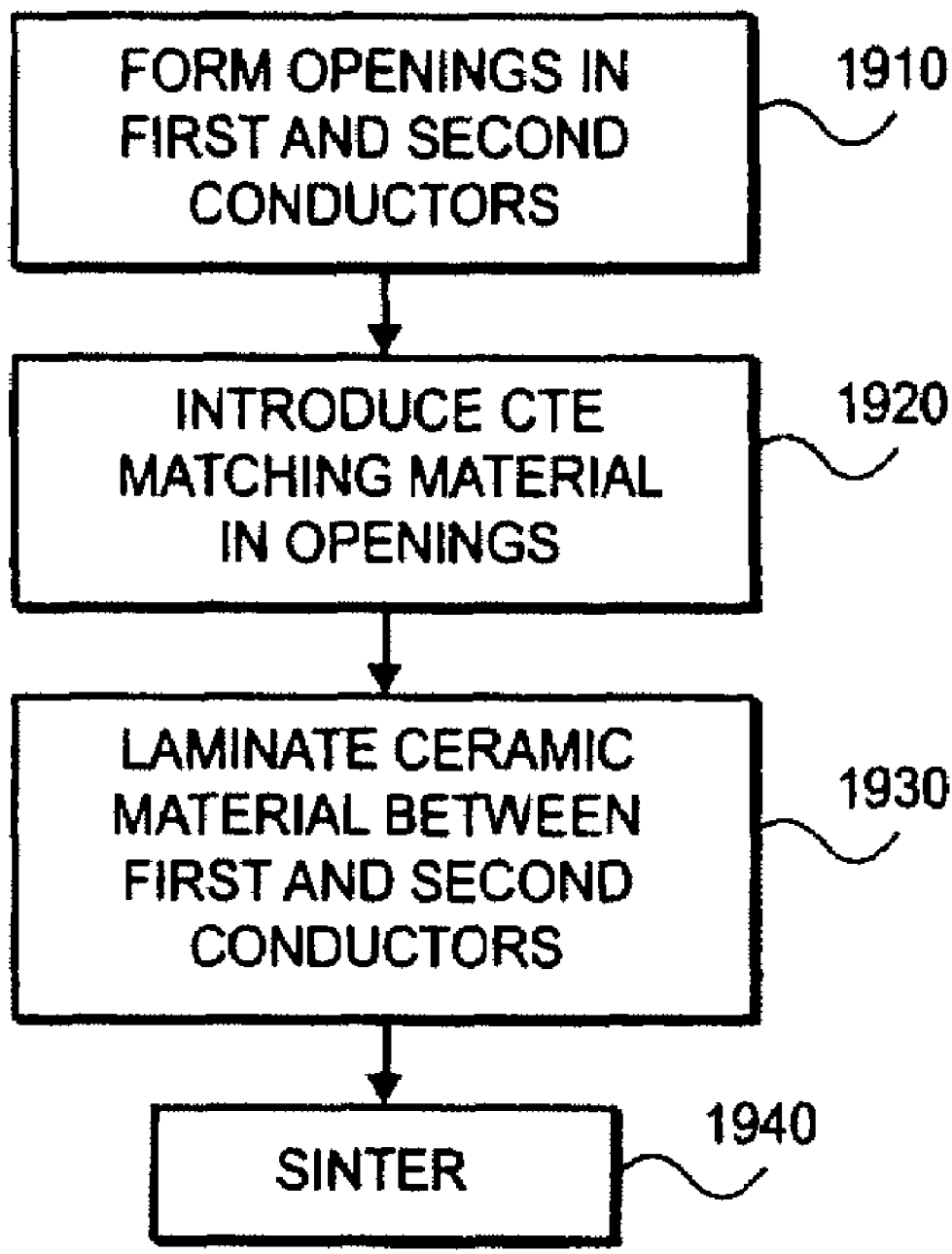
FIG. 19 describes a third process flow performing a capacitor.
Figure 20:
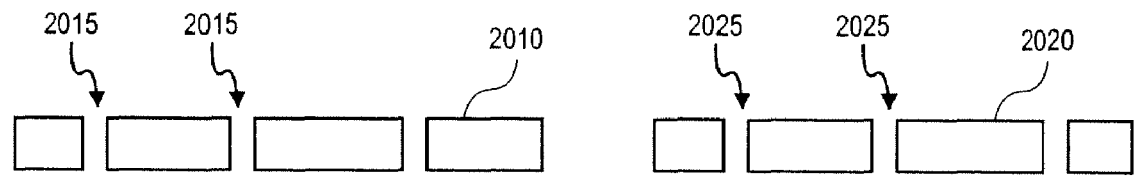
FIG. 20 shows a first conductor and a second conductor each having opening formed through a thickness thereof.
Figure 21:
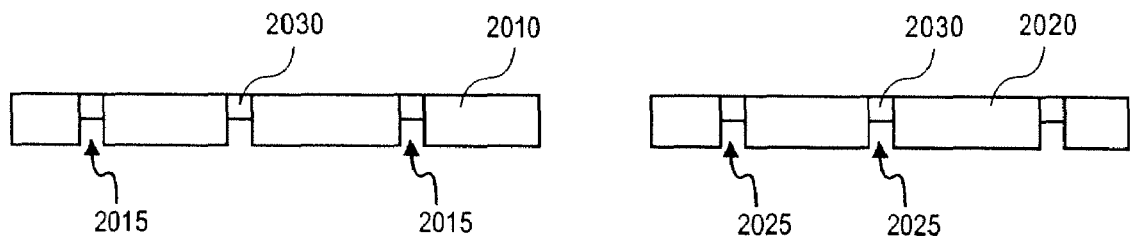
FIG. 21 shows the first conductor and second conductor of FIG. 20 having a coefficient of thermal expansion (CTE)-matching material disposed in the openings.
Figure 22:
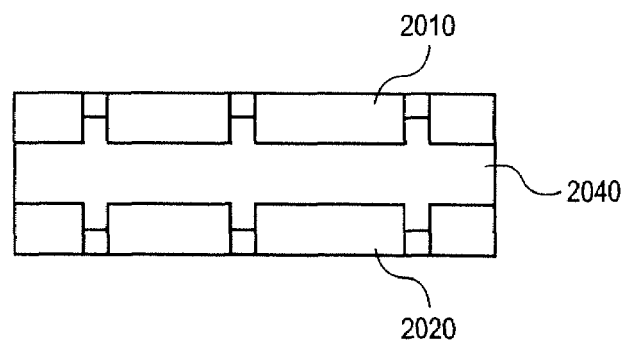
FIG. 22 shows the first conductor and second conductor of FIG. 21 connected to and disposed on opposite sides of a ceramic material.

In the above embodiments, techniques for forming capacitor structures are described where a ceramic material may be laminated to a conductive foil, such as a nickel or copper foil. Representative embodiments also describe the use of a conductive foil as one electrode and a conductive paste as another electrode. One concern with the use of a paste or green sheet for one or both electrodes is that when a capacitor is pressed in a green state, the paste may be extruded through the ceramic material and contact the opposite electrode, resulting in shorting. A problem with using conductive sheets or foils is that the adhesion strength between the ceramic and a conductor are weak and the ceramic may delaminate from the conductive sheet. Attempts have been made to use conductive foils as both the top and bottom electrodes, however, the organic content in the ceramic material cannot out-gas during processing leading to bulging/cracking of the capacitor structures. FIG. 19 describes a process of forming a capacitor structure using conductive sheets. FIGS. 20-22 show formation processes in connection with portions of the process flow described in FIG. 19.

Referring to FIG. 19, in a process of forming a capacitor structure, first and second conductors of conductive sheets or foils are provided and openings are formed through a thickness of the conductive sheets (block 1910). FIG. 20 shows first conductor 2010 and second conductor 2020 suitable for use as conductors of a thin film capacitor. First conductor 2010 and second conductor 2020 are representatively, a nickel or copper sheet (e.g., foil) having a thickness on the order of several microns to tens of microns depending on the particular design parameters. As illustrated, each of first conductor 2010 and second conductor 2020 have a number of holes formed through a thickness of the sheet. FIG. 20 shows first conductor 2010 having openings 2015 extending completely through a thickness of the sheet and first conductor 2020 having openings 2025 completely through a thickness of the sheet. Openings may be formed using laser drilling or etching techniques. In one embodiment, the number of openings are maximized to reduce the stress per linkage (linkage between openings) in the respective sheets. Representative openings on the order of 10-50 micrometers are suitable.

Referring to FIG. 19, following the formation of openings in first and second conductors, the method provides introducing a material in the opening that has a coefficient of thermal expansion (CTE) between a CTE for a material of the conductor and a CTE of a ceramic material that, in this embodiment, will serve as a dielectric of the capacitor (block 1920). In one embodiment, a suitable CTE-matching material for deposition in the openings in the conductor is a metal/ceramic paste having metal particles similar to a material for the conductor and ceramic particles similar to a material for the ceramic material that will be used for the dielectric. In one embodiment, a paste is deposited to partially fill the openings, i.e., partially extend through a thickness of the first or second conductor, respectively. In one embodiment, the material formed in the openings in the conductors is itself conductive so as not to reduce the overall capacitance of the structure (C=kA/t, where A equals the area of a conductor).

In general, a ceramic green sheet will lose organics and densify during a high temperature sintering process with a resultant shrinkage of approximately twenty percent. However, even though the ceramic material has a lower CTE than metal (e.g., 7 ppm/C versus 17 ppm/C for nickel), it may be possible to match the ceramic and metal strains. If a ceramic green sheet shrinkage is matched to nine percent, a ceramic layer can be under a compressive stress. A compressive stress will provide adhesion/retention between a ceramic and another layer. In one embodiment, material 2030 may have its CTE tuned to be under a greater compressive stress. In this manner, material 2030 may act to hold a ceramic green sheet in place in a capacitor.

FIG. 21 shows first conductor 2010 and second conductor 2020 having metal/ceramic paste 2030 partially filling openings 2015 and 2025, respectively. One technique for depositing a metal/ceramic paste is through a squeegee operation across the surface of each conductor.

Referring again to FIG. 19, following the introduction of a CTE-matching matching material and openings formed in the first and second conductors, a dielectric material, such as a ceramic material may be laminated between the conductors (block 1930). FIG. 22 shows ceramic material 2040 disposed between first conductor 2010 and second conductor 2020. Ceramic material 2040 is, for example, barium titanate or barium, strontium titanate having a thickness on the order of one micron or less. Ceramic material 2040 may be deposited between the conductors as a green sheet.

Referring again to FIG. 19, following the lamination of a ceramic material between the first and second conductors, the composite structure is thermally treated to burn-off organics. Representatively, a thermal treatment would involve a temperature range of 300 to 500° C. for a duration of between two hours and a day. The composite structure may be subsequently heat-treated in a reducing atmosphere in order to densify the ceramic material (block 1940).

FIG. 22 shows ceramic layer 2040 between first conductor 2010 and second conductor 2020.

The above description relates to forming capacitor structures within package substrates. Similar techniques may be used in the formation of capacitors in other environments, such as in printed wiring boards (e.g., printed circuit boards).

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. An apparatus comprising:
    a first electrode, a second electrode, and a dielectric material disposed between the first electrode and second electrode,
    wherein at least one of the first electrode and the second electrode comprises a plurality of holes formed in a surface thereof, wherein each of the plurality of the holes defines a volume and wherein a portion of the volume comprises a material having a coefficient of thermal expansion between a coefficient of thermal expansion for a material for one of the first electrode and the second electrode and a coefficient of thermal expansion for a material for the dielectric material.

2. The apparatus of claim 1, wherein the plurality of holes extend through a thickness of the at least one of the first electrode and the second electrode.

3. The apparatus of claim 1, wherein each of the plurality of the holes defines a volume and wherein a portion of the volume comprises a conductive material.

4. The apparatus of claim 1, wherein each of the first electrode and the second electrode comprises a plurality of holes completely through a thickness of the first electrode and the second electrode.

5. An apparatus comprising:
    a first electrode, a second electrode, and a dielectric material disposed between the first electrode and second electrode,
    wherein at least one of the first electrode and the second electrode comprises a plurality of holes formed in a surface thereof, wherein the holes comprise a sufficient number of holes having a sufficient diameter to reduce the stress per linkage between openings in the first and second electrodes during sintering of the first electrode, the second electrode, and the dielectric material.

6. The apparatus of claim 5, wherein the apparatus comprises a thin film capacitor; and the first and second electrodes comprise one of a nickel and a copper foil having a thickness between several microns and tens of microns; and the holes have a diameter of between 10 and 50 micrometers.

7. A method comprising:
    forming openings in a surface of at least one of a first electrode and a second electrode;
    introducing a material in the openings; and
    laminating a dielectric material between the first electrode and second electrode, wherein introducing comprises introducing a material in the opening that has a coefficient of thermal expansion between a coefficient of thermal expansion for a material for one of the first electrode and the second electrode and a coefficient of thermal expansion for a material for the dielectric material.

8. The method of claim 7, wherein forming comprises one of laser drilling and etching operation to form the openings completely through the first electrode and the second electrode.

9. The method of claim 7, wherein laminating comprises laminating a ceramic material of one of barium titanate, barium, and strontium titanate to a thickness of one micron or less.

10. The method of claim 7, further comprising sintering the first electrode, the second electrode, the material in the openings, and the dielectric material.

11. The method of claim 10, wherein sintering comprises at least one high temperature sintering process to burn off organics and densify the dielectric material with a resultant shrinkage of approximately twenty percent.

12. The method of claim 10, wherein forming comprises forming a sufficient number of openings having a sufficient diameter to reduce the stress per linkage between openings in the first and second electrodes during sintering.

13. A method comprising:
    forming openings in a surface of at least one of a first electrode and a second electrode;
    introducing a material in the openings; and
    laminating a dielectric material between the first electrode and second electrode, wherein introducing comprises introducing a material in the opening that is a metal/ceramic paste having metal particles similar to a material for one of the first electrode and the second electrode and having ceramic particles similar to a material for the ceramic material used for the dielectric.

14. The method of claim 13, wherein introducing comprises introducing a conductive material in the openings.

15. A system comprising:
a computing device comprising a microprocessor, the microprocessor coupled to a printed circuit board through a substrate, the substrate comprising a first capacitor structure comprising a first electrode, a second electrode, a dielectric material disposed between the first electrode and second electrode, and a plurality of holes formed in a surface of least one of the first electrode and the second electrode, wherein each of the plurality of the holes defines a volume and wherein a portion of the volume comprises a material having a coefficient of thermal expansion between a coefficient of thermal expansion for a material for one of the first electrode and the second electrode and a coefficient of thermal expansion for a material for the dielectric material.

16. The system of claim 15, wherein the first capacitor structure is coupled to a substantially planar surface of the substrate, the planar surface coupled to one of a die side of the substrate under the microprocessor, and an opposite side of the substrate from the die side.

17. The system of claim 15, further comprising a second capacitor structure coupled to one of a die side of the substrate under the microprocessor, and an opposite side of the substrate from the die side; the second capacitor structure comprising a first electrode, a second electrode, a dielectric material disposed between the first electrode and second electrode, and a plurality of holes formed in a surface of at least one of the first electrode and the second electrode.

18. An apparatus comprising:
a first electrode, a second electrode, and a dielectric material disposed between the first electrode and second electrode,
wherein at least one of the first electrode and the second electrode comprises a plurality of holes formed in a surface thereof, wherein each of the plurality of holes defines a volume and wherein a portion but not all of the volume comprises a first material, and wherein a remainder of the volume comprises a second material.

19. The apparatus of claim 18, wherein at least one of the first electrode and the second electrode comprises a metal; wherein the first material comprises the metal and the dielectric material; and wherein the second material comprises the dielectric material.

20. A method comprising:
forming openings in a surface of at least one of a first electrode and a second electrode;
introducing a material in the openings, wherein introducing comprises introducing a material to partially, but not completely fill the openings; and
laminating a dielectric material between the first electrode and second electrode.

21. The method of claim 18, wherein introducing comprises introducing a paste having a coefficient of thermal expansion tuned to have a compressive stress, after laminating, that is sufficient to provide adhesion/retention between the dielectric material and one of the first electrode and second electrode.

* * * * *